United States Patent

Holzmann

[11] Patent Number: 5,395,040
[45] Date of Patent: * Mar. 7, 1995

[54] APPARATUS FOR FORMING SURFACE MOUNT SOLDER JOINTS

[75] Inventor: Damian J. Holzmann, Vero Beach, Fla.

[73] Assignee: Mask Technology, Inc., Santa Ana, Calif.

[*] Notice: The portion of the term of this patent subsequent to May 10, 2011 has been disclaimed.

[21] Appl. No.: 186,741

[22] Filed: Jan. 26, 1994

Related U.S. Application Data

[60] Continuation of Ser. No. 881,872, May 12, 1992, Pat. No. 5,310,574, and a continuation of Ser. No. 42,202, Apr. 2, 1993, which is a division of Ser. No. 881,872, Apr. 2, 1993.

[51] Int. Cl.$^6$ ................................................ B23K 1/20
[52] U.S. Cl. .................................... 228/254; 118/58; 118/213
[58] Field of Search .................. 228/254, 253; 118/58, 118/213, 504, 109

[56] References Cited

U.S. PATENT DOCUMENTS

| | | | |
|---|---|---|---|
| 4,678,531 | 7/1987 | Metzger et al. | 118/504 X |
| 4,729,306 | 3/1988 | Bubley | 101/127.1 |
| 4,789,096 | 12/1988 | Dunn et al. | 228/234.1 A X |
| 5,051,339 | 9/1991 | Friedrich | 427/96 |
| 5,310,574 | 5/1994 | Holtmann | 427/96 |

Primary Examiner—Kenneth J. Ramsey
Attorney, Agent, or Firm—Richard T. Holzmann

[57] ABSTRACT

The object of this invention was to construct an apparatus for forming solder deposits on a Surface Mount Device (SMD) pad on a printed circuit or hybrid board. This formed solder deposit is in a defined three-dimensional well having the proper profile and a defined solder gap. The solder before forming can be solid solder or a solder paste. By the placement of a mesh on the surface of the circuit board and the application of a slight positive pressure and tension on the mesh with vibration thereof and subjecting this system to a temperature just low enough to reflow the solder by means of a heat transfer fluid either liquid or gaseous, then cooling the board to solidify the solder, a product results having the desirable properties even when block printed. The use of this apparatus eliminates most of the problems of prior art approaches by providing uniform heating at a very short dwell time at temperature in the presence of the mesh. Furthermore, any short circuits originally present in the board or those formed during its processing are subsequently removed during treatment in the apparatus. The duration of the application of heat and pressure is made so brief, that the laminate structure of the board and the coating thereon remain substantially unaffected.

16 Claims, 5 Drawing Sheets

APPARATUS FOR FORMING SURFACE MOUNT SOLDER JOINTS

This is a continuing application of Ser. No. 07/881,872, filed on May 12, 1992, now U.S. Pat. No. 5,310,574, the divisional application thereof Ser. No. 08/042,202, filed on Apr. 2, 1993; and the PCT application No. PCT/US 93/04168 filed May 3, 1993, in the USPTO and designating the United States.

FIELD OF THE INVENTION

This invention relates to an apparatus for forming solder deposits on a Surface Mount Device (SMD) pad on a printed circuit or hybrid board.

BACKGROUND OF THE INVENTION

Various methods are known for applying solder selectively to printed circuit boards (PCBs) in such a way that following the assembly of the boards with SMD components, the boards can be electrically and mechanically connected to the components by reflow soldering methods.

In particular, the prior art uses a method in which the solder deposit is applied to selected regions of the PCB in the form of a deposit of solder by screen or stencil printing with soldering pastes. While this method is in common use today, nevertheless, in many respects, this method has many problems and cannot be considered optimal. The investment cost of screen printing equipment is considerable; thin solder deposits are often produced; thixotropic properties of pastes change; soldering pastes are expensive; resolution is limited; optoelectronic positional recognition of assembly systems involves great difficulties; the flexibility of interlinked production lines having screen printing is greatly impaired because these machines entail considerable set-up times and adjustments; heating speed of the introduction of heat in reflow soldering with solder pastes has proven to be limited because, in the heating process, volatile ingredients and solvents from the paste have to evaporate which takes time; and, other disadvantages associated with solder paste are: a) bubble formation, b) oxidation of the soldering paste, c) fine granulation and the like. An additional problem, not associated only with screen printing is that the solder forms "bumps", that is, the solder has a more or less convex cross-sectional shape making placement difficult and contributing to rework.

Another previously used method in the prior art is known as immersion application of solder to PCBs. In this method, a prepared PCB is dipped into and removed from a solder bath. After being removed and following a cool down phase, the metallized regions of the PCB provided with a solder resist means are provided further with a solder deposit, which, however, forms the solder bump because of the high surface tension of solder. The height of the solder deposit is also dependent on the dimensions in the plane of the PCB of the regions to which solder is to be applied, so that when such regions have different dimensions, variably high solder deposits necessarily result.

U.S. Pat. No. 5,051,339 issued Sep. 24, 1991 to Friedrich et al., the so-called "OPTIPAD" process, is an attempt to overcome some of these disadvantages, the major one being the solder "bump". Because this is an immersion process, there are no foreign ingredients, that is, no ingredients but solder in the solder deposits. The process, simply stated, involves procuring a PCB having thereon a solder mask with pads exposed, laminating thereto a photoimageable layer of perhaps 5 mil in thickness, exposing and developing so that everything is masked but the pads to be soldered, immersing the thus prepared PCB into molten solder, and then contacting the board with a closure element to maintain the solder in place and keep the surface flat until it solidifies. Optionally, the limiting layer, a photoimageable solder resist mask or a regionally applied foil layer, can be left on if the component has leads which must be connected to the pads or can be removed if SMD leadless components are used.

The "OPTIPAD" process requires the use of a 5 mil temporary coating which is imaged, developed where the pads are and then immersed in molten solder. Others are attempting to modify this process by screening the molten solder into the pad wells. Stripping the temporary layer leaves behind a 5 mil high pillar of solder. Aside from the need for expensive equipment which is not commercially available, this process has two major problems. When the temporary coating sees molten solder it cures extensively and is difficult to remove even when stripping with caustic soda which can attack the permanent mask. In addition, when the 5 mil solder mask is stripped it leaves high pillars of solder which in fine pitch applications when mated with their components collapse and generate extensive shorts.

In addition to the '339 patent mentioned above, there are two other relevant publications; a paper by W. J. Maiwald of Siemens entitled, "Reliable Reflow Soldering Techniques using Preformed Solid Solder Deposits, Part 2—The Assembly Process" and the associated paper by M. Weinhold of DuPont entitled, " . . . Part 1—The Printed Circuit Fabrication Process".

The Siemens process combines a few known technologies and produces a flat solid solder deposit on the PCB. The processing steps are applying solder pastes onto boards with permanent solder masks, melting of the solder paste and flattening of the round, humped solder deposits by a thermal/mechanical process.

Neither of these two processes have been completely successful. The former is run in an extremely aggressive environment, that is, molten solder at 450 degrees F. Both require highly specialized equipment, although in the latter attempts are being made to run this process in a conventional multilayer press normally used for PCBs. The problem here is that this type of press requires about 2000 psi before activation, and though the platens see the top of the solder first, they then contact the PCB itself and thermally shock the laminate, oftentimes scorching and mechanically damaging the solder mask as well. Furthermore, the solder when compressed, squeezes sideways as a very thin film or foil. While this problem can be solved by various techniques to remove the foil, it results in extensive and expensive rework and fine droplets of the thus squeezed out solder end up as solder balls which are difficult to remove.

The major problems which both of these processes have attempted to address are the following: opens and shorts, squeezing out of solder and resultant solder bridging; low packing density and inability to solder with high pin counts without extensive design modifications; inability of the paste to maintain its profile after printing; achieving the required shape of the deposit; presence of a "hump", the meniscus, makes positioning of fine pitch components difficult resulting in unacceptable skewing tolerances; solder balls; shelf-life of solder joint; poor solderability due to too thin deposits; poorly defined soldering gap; inability to quantify and standardize solder deposit and solder gap; and yield after soldering. First-pass yields in standard applications are running at 60-70%, while for many fine pitch cases they are only 10% and, therefore, rework is extensive.

The solutions and benefits both of these approaches have attempted to achieve in addition to solving the above problems are as follows: removal of the solder paste printing process from the assembler's operation; the assembler would then use a 100% tested presoldered board since faults arising from solder application can be separately controlled, eliminated or reworked at the PCB fabricator without the obstruction of components; the problem of solder paste deposits being deformed when the component terminals touch down would be non-existent; components can be placed on a flat surface which would permit the use of fine-pitch flat packs and TAB assembly with automated equipment; the possibility of quantifiable and standardized solder deposits and solder joints; better yield after soldering with considerable reduction of rework, higher first pass yields; better overall quality of boards and solder joints, improved product consistency; and, lower cost due to faster throughput in assembly with shorter SMD assembly lines.

In conclusion, both of these new processes leave much to be desired and are not very practical in their present state of development. As a consequence, the study which resulted in this subject invention was undertaken.

SUMMARY OF THE INVENTION

The object of this invention was to construct an apparatus for forming solder deposits on a Surface Mount Device (SMD) pad on a printed circuit or hybrid board which would eliminate most of the problems of prior art approaches by providing very uniform heating and a very short dwell time at temperature. By the placement of a mesh on the surface of the circuit board with the solder paste in place on the pads, applying a slight positive pressure and tension on the mesh with vibration thereof, until the paste is sifted, and subjecting this system to a temperature just low enough to reflow the solder by means of a heat transfer fluid either liquid or gaseous, then cooling the board to solidify the solder, a product results having the desirable properties. This formed solder deposit is in a defined three-dimensional well having the desirable profile and a defined solder gap. It is immaterial whether the solder before forming is solid solder or a solder paste. Furthermore, any short circuits originally present in the board or those formed during its processing are subsequently removed during treatment in the apparatus.

BRIEF DESCRIPTION OF THE DRAWINGS

The invention of the present application will now be described in more detail with reference to the preferred embodiments of the apparatus, given only by way of example, and with reference to the accompanying drawings, in which.

DESCRIPTION OF THE PREFERRED EMBODIMENTS

The heat transfer fluid/mesh technique of the preferred embodiments of this invention has the following major features:

1—uniform heating at a temperature only slightly above the melting of the solder;

2—gentle application pressure;

3—protection of the laminate, the board and the permanent solder mask during the forming of the solder;

4—the release agent character of the fluid allowing easy separation of the mesh from the solid solder after cool-down; and 5—the ability to maintain a proper form of the solder despite variations in the amount present.

The results achieved in this invention were the outcome of a stepwise development program which encountered a number of failures though many of these failures themselves may be considered to be improvements over current technology.

The development work was largely an attempt to overcome the known weaknesses of the prior art processes. Both of these processes use direct contact of a hot metal plate with the PCB surface to flatten the solder bump, whereas in this invention, mesh is used to shape the solder deposit. With a heat transfer fluid, be it liquid or air, all surfaces are in contact at the same time and at the same temperature, thermal decomposition of the laminate does not ensue. With these flattening processes, the less they are subjected to heat, the better. Normal soldering techniques do not exert any mechanical force on the boards, but these prior art techniques must, yet this invention exerts very little.

The early stages of this investigation sought to mitigate this harsh metal contact by the use of a heat transfer fluid (a hot synthetic oil or air in most cases) and the substitution of various pressure and auxiliary plates, the auxiliary "plates" being polymer or rubber interfaces between the pressure plate and the PCB.

The following working examples are illustrative of this early investigation.

A—These experiments employed reflowed solder paste on the board with stainless steel plates (pressure transmitting surface unless otherwise noted) using a standard PCB in the test fixture, which was immersed in hot heat transfer fluid (a synthetic oil), at a temperature of 395 degrees F unless otherwise noted.

1—With reflowed paste and a "KAPTON" film (to contain solder squeeze out) plus the metal plates, solder foil formed anyway.

2—With lamination in a commercial Solder Mask Vacuum Laminator of a 4 mil "VACREL" 8040 (a DuPont trademarked product widely used as a dry film resist) temporary film over the permanent 2.5 mil 8040, extensive squeeze out occurred and severe curing and blistering of the temporary film so that it could not be removed.

3—Vacuum Lamination using a rubber bladder backed up by plates, again resulted in extensive foil formation and a rubber residue remained on the board. Proper selection of a high temperature silicone rubber solved the deposition problem but not the squeeze out.

4—Aluminum Foil—foil formation and wrinkles in the solder;

5—Aluminum Plates—foil formation and a galvanized-like, dull-looking finish on the solder; highly polished aluminum resolved the finish problem, but not the foil formation.

6—Stainless Steel Plates—foil formation and an impression of the grain of the highly polished steel plates were on the solder; also required longer dwell time and cool-down due to its heat transfer characteristic.

7—Glass Plates—produced a shiny and reflective solder surface. One could see the outgassing and the foil formation as it developed.

During the course of these experiments fluid temperatures and cycle times were varied without any significant beneficial effect. It should be mentioned that when there was foil formation, oftentimes an 1100 psi water spray would remove it, but usually incompletely. Any remaining small specks of solder would convert to solder balls upon reflow potentially causing shorts on assembled boards.

B—In these experiments the temperature was varied, in degrees F, they were: 450, 425, 405 and 390. Temperatures from the softening point of solder to 405 degrees are adequate.

C—Dwell times were varied at intervals in minutes of 1,2, 3, 4, and 5. Two to three minutes appeared to be all that was necessary, although boards thicker than the standard 0.064 in., i.e., up to 0.125 in. took up to the full 4–5 minutes.

The conclusions from these experiments follow.

1—Any planar pressure plate alone will cause squeeze-out (foil formation) so long as there is excess solder present. In these experiments, our pressure plate is actually a film of hot heat transfer fluid.

2—The ideal situation is to conduct the forming rapidly and at as uniform a rate of heat rise as possible, adequate to reflow the solder while not shocking and scorching the laminate or curing a temporary mask. In these experiments temperatures of 450, 425, 405 and 390 degrees Fahrenheit were used and 385–405 seems to be optimum. Cycle times were of the order of 2–3 minutes.

3—Reftowed solder with a shiny surface is apparently the most desirable, reflecting no change in the eutectic ratio of optimum Sn/Pb composition. A dull surface usually means either oxidation of the solder or an enrichment of Pb at the surface.

4—What is required is something to prevent squeeze-out, something which is not a continuous planar pressure plate.

D—The most significant development, that is, the use of a mesh covering the surface of the board, immediately resolved the problems of bubbles from outgassing, foil formation, discoloration of the solder, as well as any excess or deficiency of solder on the pad. All the above experiments were repeated using mesh and the same benefits were achieved. Another important development was-that not only were the results achieved with solid solder and solid solder resulting from the reflow of solder paste, but they were also realized from solder paste without being reftowed. Not only did the foil disappear, but as important, the mesh not only caused the excess solder to rise up, but to flow down the well thereby forming a most desirable solder configuration.

The concept is to lock-in the area into which the solder can travel thereby preventing sideways squeezing and promoting squeezing upwards (as well as downwards should there be insufficient solder in the well). The solder is then formed in a most desirable configuration. The main features being that the spreading of solder is prevented, solder balls which do form are easily removed, the well is filled, low volume solder deposits are optimized and all this is done at an exposure to a rapid and uniform temperature thereby preventing deterioration of the mask and the board. This process not only eliminates solder balls from the final product either by scraping them off the mesh or by subsequent cleaning, but even shapes the excess solder into a more desirable form by raising the solder above the mesh for the mating with surface mount components. Furthermore, the well is filled, any outgassing is controlled and should little solder be present, it is formed to optimize its volume. It should be noted that when the process was run in the apparatus of this invention, the results were actually superior to those observed on a laboratory scale.

The mesh material may be of conventional stainless steel wires, glass cloth or a chemical milled screen or even a laser-machined plate in a configuration so that it behaves like a screen preventing sideways flow and promoting flow upward.

This technique, as evidenced by micro-sectioning, resulted in filling the well assuring one of a superior solder joint. The height of the thus formed solder will also require less pressure to achieve wetting of the surface mount component since the solder is formed above the surface of the solder mask without the need for the temporary mask of the Optipad invention. The Sipad process lacks this important feature.

Incidentally, while all that is needed is merely to lay the mesh on the board surface, a slight tension on the mesh produces a marked improvement. The pressure required on the mesh can easily be achieved by hand. The use of a rubber sheet between the mesh and the pressure plate resulted in a slight further improvement due to its ability to conform to the topography of the board. It did appear to be beneficial with low solder deposits by preventing the solder to rise too far, and made it easier to peel the board off at the end of the treatment. Uneven pressure on the mesh is not significant so long as it is in planar contact. The pressure is very modest; too much pressure will increase the squeeze out. However, since the squeeze out rises above the mesh in the form of solder balls it is easily removed while molten by the scraper attached to the heating element. Alternatively, electromechanical, pneumatic or hydraulic-actuated systems could vary this slight pressure to adjust to part numbers with varying configurations if required.

Repeating all the above experiments utilizing the mesh on reftowed solder similarly gave excellent results.

Subsequently, an experiment was run wherein a screened solder paste, without being reftowed, was covered with mesh, placed in the fixture and subjected to the hot heat transfer fluid under pressure. The results were also excellent. Not only was there no squeeze out, but the solder was well-formed and especially shiny. Microsections confirmed these results and verified that the solder filled the well. A most important feature of this invention is that the heat transfer fluid/mesh technique works regardless of how the original solder deposit is laid down, e.g., by electroplating, by immersion in a molten solder bath, by screen printing a solder paste, or however. It works as long as the solder is there, be it as solid solder, solder paste, or whatever. Furthermore, the fluid acts as a release agent allowing easy removal of the mesh from the solder after cool-down.

The impact of these experiments is most important. Instead of adding three soldering steps over the conventional approach, i.e., reflowing each side separately and then an additional soldering/forming step before attaching the components; now only one soldering step is needed if solder paste deposits on both sides are originally reflowed and formed at the same time. Screening equipment used today in the assembly plants handles the boards by the edge to allow for screening the backside with components thereon. If one does as above, the entire operation is greatly simplified and with a much superior finished product.

Assembly operations today are fully automated even for the application of solder paste. Unfortunately, even paste deposited with expensive automatic equipment is not easily reproducible. This kind of technology is alien to the assembler and more properly belongs in either the PCB fabricator's shop or in a service bureau. The solder paste itself consists of balls of solder essentially held together in a system with about 25-50% solvent-carrier. The paste also has a relatively short shelf-life aggravating the problems in its handling. Wave soldering is not a solution since many components cannot be subjected to wave conditions. However, this invention is independent of whether the solder has been applied by wave, bar or laser techniques.

In a typical current process, solder paste is screened onto the bumpy surface; a pick-and-place machine places the components and the machine stops when in contact with the bumps. However, in low pitch applications, the solder paste deposit usually will displace sideways and contact another bump shorting the circuit.

Furthermore, 10 mil pitch cannot be screen printed efficiently at all; it is usual for fabricators to rework about 70% of the leads at the present state of technology. Block stencil printing, however, eliminates the need for low pitch screen printing completely. By stenciling a block of pads with solder, that is, by creating a mass of short circuits and then removing the shorts with this mesh technology, since the excess solder does not wet the mask, 10 mil pitch is readily achieved.

Manufacturers of solder pastes have been spending considerable effort over the last several years in improving the pastes to allow higher yields in printing fine pitch. In particular, they have been centrifuging to obtain solder in the paste in the particle size range of 15-25 microns which represents only about 4% of their starting material. Consequently, the cost of these specially treated pastes has risen greatly. With this invention, the technology of the solder paste properties is removed and inexpensive older technology pastes can now be effectively used.

Getting paste out of assembly, and into the PCB fabricator's shop, increases productivity greatly due to its automatic nature, save for the paste application. Reflow is speeded up and simplified since the impurities in the paste, which cause outgassing and produce solder balls, are already removed.

Additionally, there is no need to modify board design, i.e., land configurations, solder mask or stencil artwork, etc., currently used; the method and apparatus accomodates itself to existing topographies.

Another observation should be recorded. The reflowed formed board should probably be quenched quickly. Quenching is reported to be metallurgically necessary. In this invention, the quick cool down is easily achieved in air without any detrimental effects. When reflowing, the heating element is usually placed less than one inch from the solder, whereas when returning the heating element to the home position back over the PCB, the heating element is about three inches above the board. The hot air at this distance actually promotes cooling of the board and release of the mesh from the reflowed solder.

To summarize, the advantages of the use of mesh are that it: is a conduit for bubbles, allowing the outgasses to be readily evacuated; contains the solder deposit in the x, y, and z directions by moving the molten solder upwards and downwards within the mesh wicking the solder back to the pads; shapes the solder deposit without formation of "bumps"; fills the well with solder without squeeze-out; increases pad size slightly thereby presenting an easier "target" for placement of the SMD by containing the molten solder within the approximate periphery of the pad; allows variation of the count, as well as the thickness, wire diameter and the weave, consistent with this mesh count of approximately 60-300. While a 60 mesh screen is acceptable for a ground plane, 220 mesh is better for a 20 or 50 mil pitch but a sample of production lots would be required to optimize performance; allows a pad to hold more sticky flux than a perfectly planar one, thereby improving adhesion of components at assembly, since the mesh produces a grid pattern on the top surface of the solder which is the impression of the mesh itself presenting a larger area to the flux, it is not flat; creates pad shapes which are irregular but, nevertheless, give optimum performance; is being used as a die (mold) for the solder or paste and can "capture" even inordinately high volumes of solder, therefore, the need to blast off squeeze out or scrub with a stiff nylon bristle brush, posssibly damaging the permanent solder mask and requiring extensive rework, is eliminated; eliminates foil formation by proper selection of mesh size; eliminates the need for thicker (4 mil) or removable (5 mil) solder mask; performs its function whether the substrate is a printed circuit board laminate or a ceramic hybrid or wherever else solder is applied to a relatively flat surface, so long as the substrate can withstand the temperature, the slight pressure and the environment of the heat transfer fluid; allows the standardization of solder joints; and very high first pass yields can now be realized. Furthermore, all of this is done without the necessity of design modifications required in other approaches.

In this invention, the "humps" or "bumps", or whatever configuration the surface of the solder deposit is in, contact the mesh in this apparatus due to the pressure of the chase containing the mesh as it is lowered. This permits rapid and intimate heat transfer unlike in the absence of fluid where thermal shock is normal because of the intimate contact with very hot metal. The cycle time varies depending on the size and number of the boards used in each run. The system lends itself easily to automation. When the bumps are squeezed they assume a shape as a function of the size and shape of the mesh openings and of the weave. As the component is placed (with adhesive or "sticky" flux for example), the board goes to reflow (inert gas, hot air, IR or whatever); the solder, which now is in a shape controlled by the mesh wherein the surface is planar with the impression of the mesh thereon, protrudes above the board thereby "finds" the metal leads which are typically solder or tin, and wets the surface.

Figure 1:
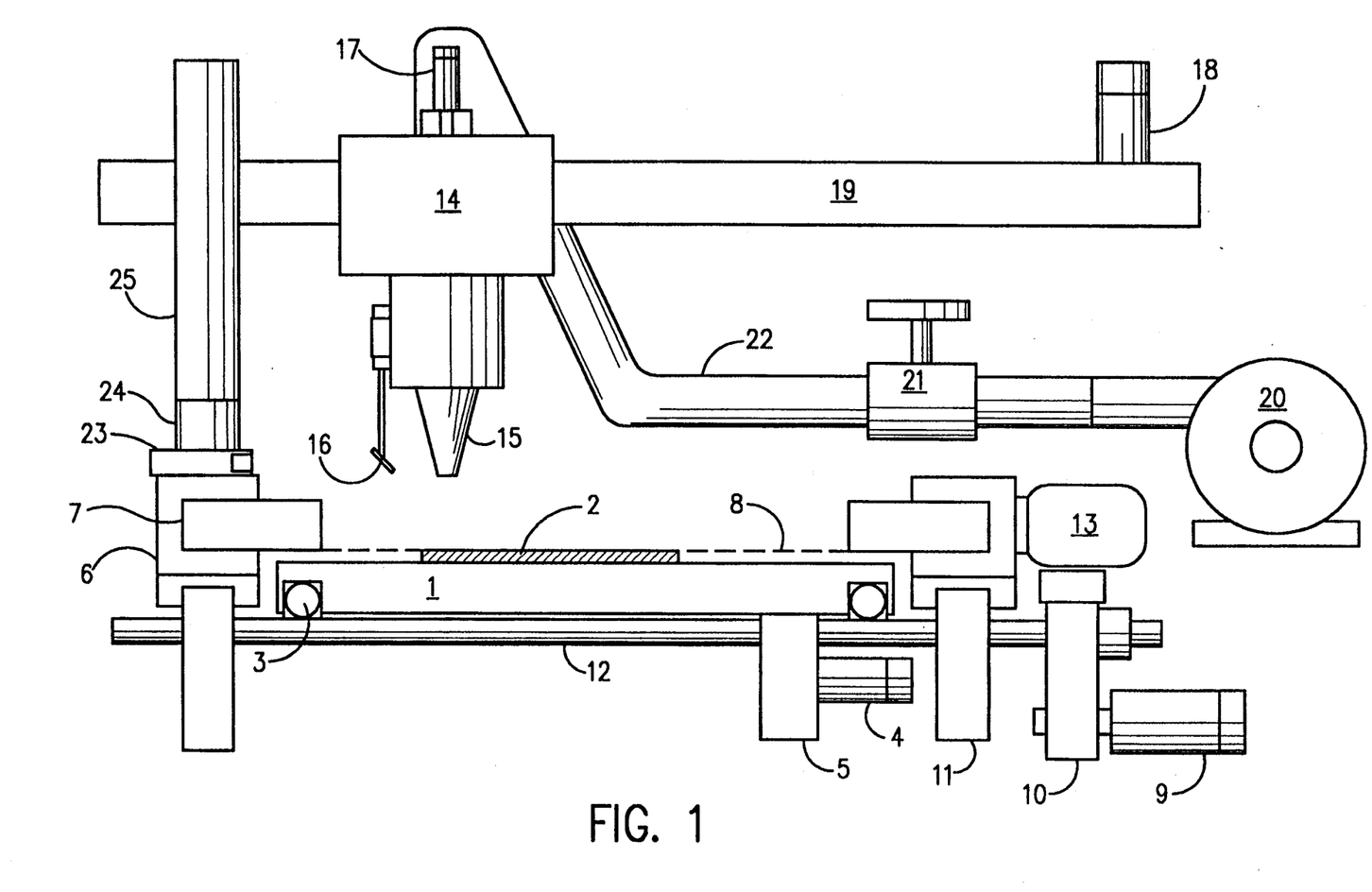
FIG. 1 is a schematic frontal view of the apparatus.

The object of this invention was to construct an apparatus which would embody the improvements uncovered in this investigation to allow commercial exploitation of its potential. We now proceed to a description and operation of the apparatus which is the subject matter of the instant invention. FIG.1 is a schematic frontal view of the apparatus wherein table 1 supports a PCB 2 having solder paste on the pads to be formed. Linear bearings 3 allow motor 4 and actuator 5 to move table 1 in an out of the body of the machine. Frame 6 supports chase 7 which contains mesh 8 to be lowered onto the PCB under tension upon activation of motor 9, gears 10, cams 11 and cam shaft 12. Vibrator 13 vibrates mesh 8 to promote sifting of solder paste upwards through the mesh and enhances contact of the mesh with the solder mask. Heating element 14 heats air forced through nozzle 15 to a temperature adequate to melt the solder. Scraper 16, attached to the heating element, follows the heating element as it moves along the PCB in order to remove any excess solder from the mesh. Motor 17 moves the heating element up and down to control the temperature on the solder and PCB while motor 18 and actuator 19 move the heating element in a left to right and return direction. Blower 20 provides ambient air through air regulator 21 and hose 22 to the heating element. Exhaust manifold 23 and air amplifier 24 a commercial air ejector exhausting a 15-fold increase of air from manifold 23 over the quantity of pressurized air input to the ejector are used to exhaust air from the chamber through exhaust duct 25.

Figure 2:
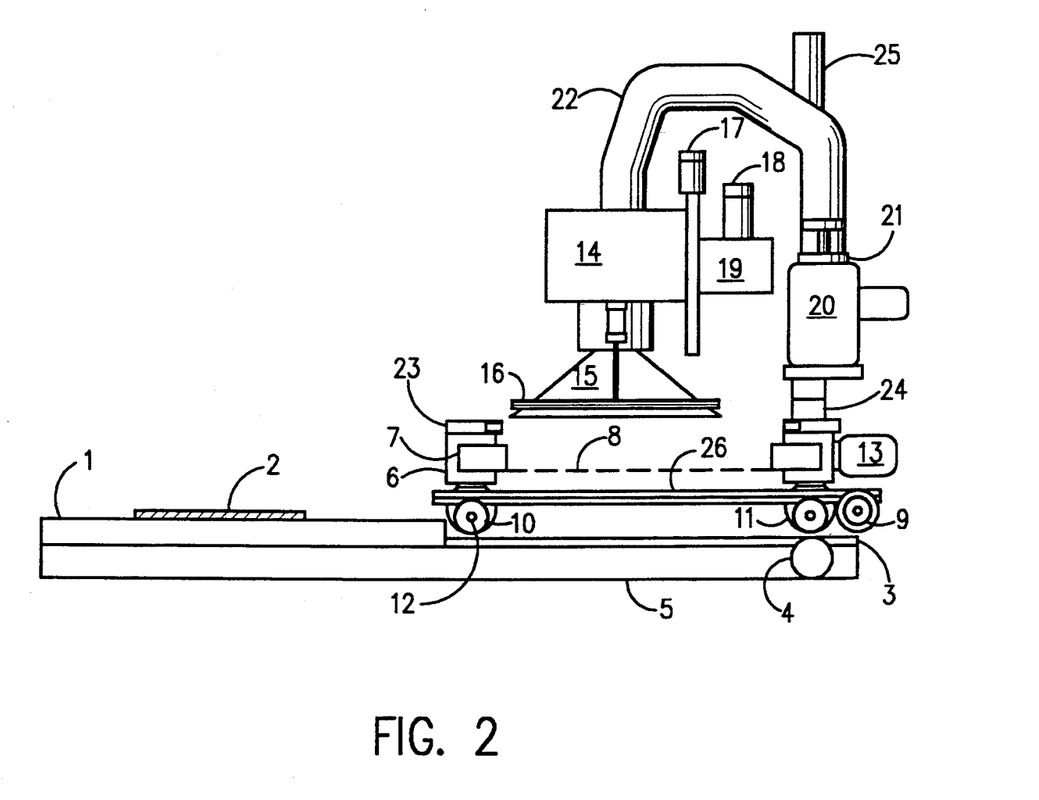
FIG. 2 is a schematic side view of the apparatus.
Figure 3:
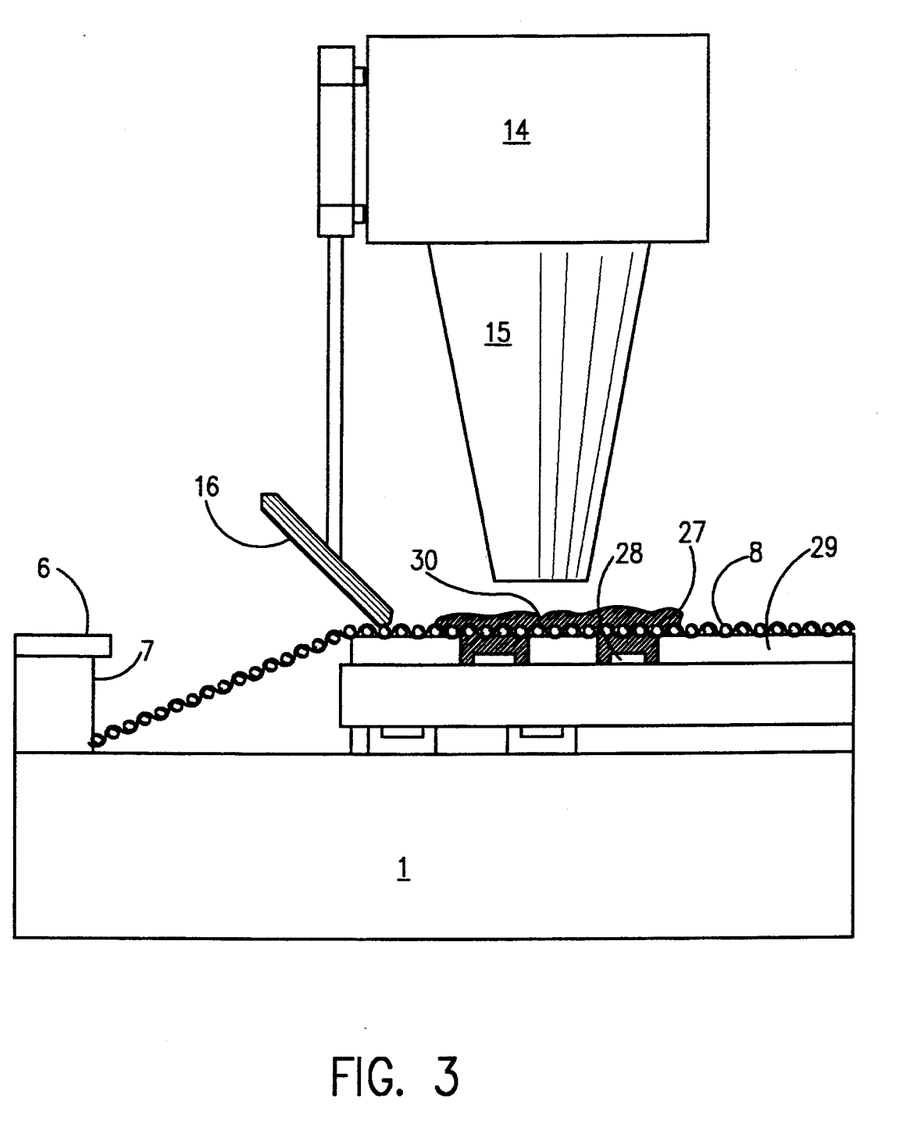
FIG. 3 is a schematic sectional view of the PCB to which solder paste has been applied, in place in the apparatus and before reflow soldering.
Figure 4:
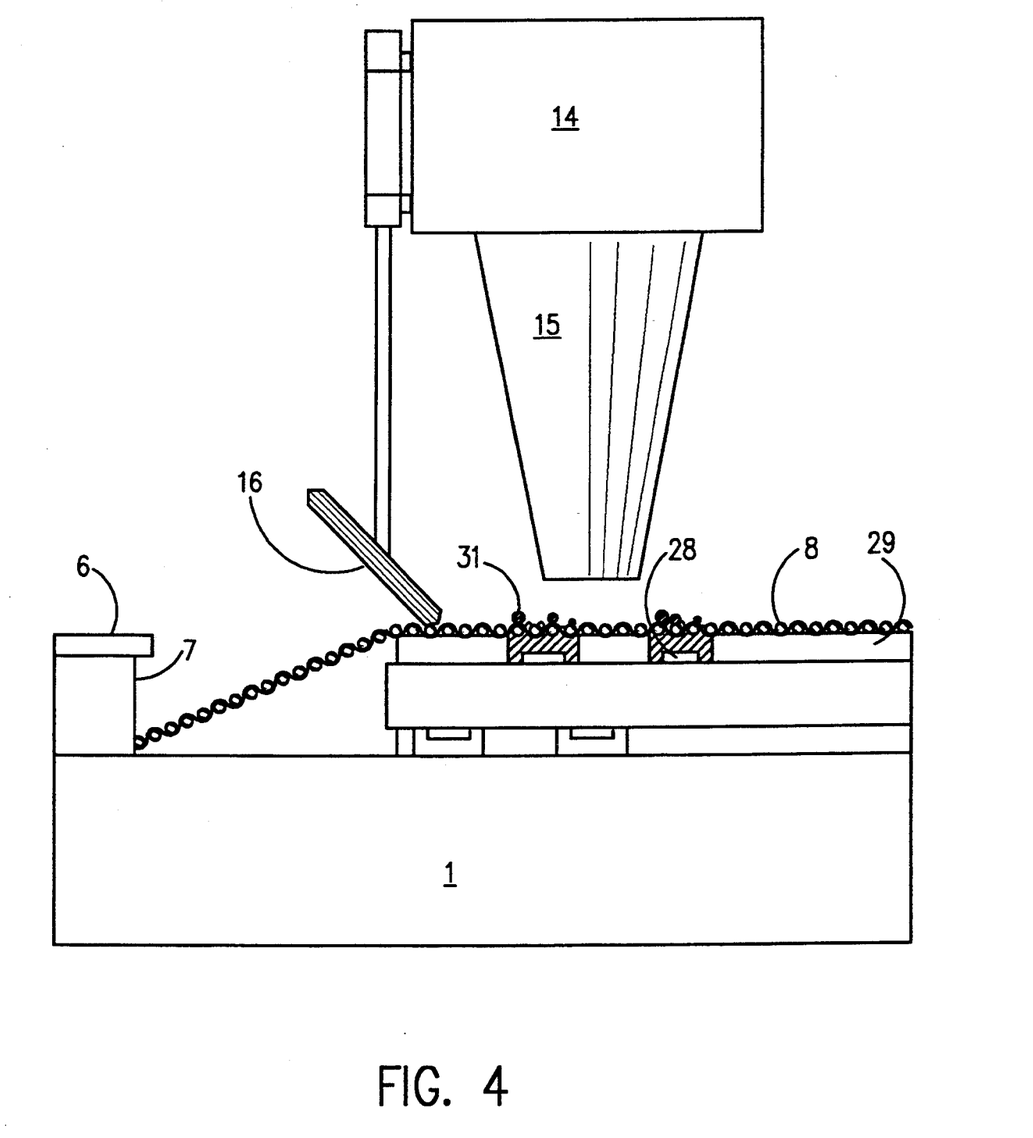
FIG. 4 is a schematic sectional view of FIG. 3 after reflow soldering.
Figure 5:
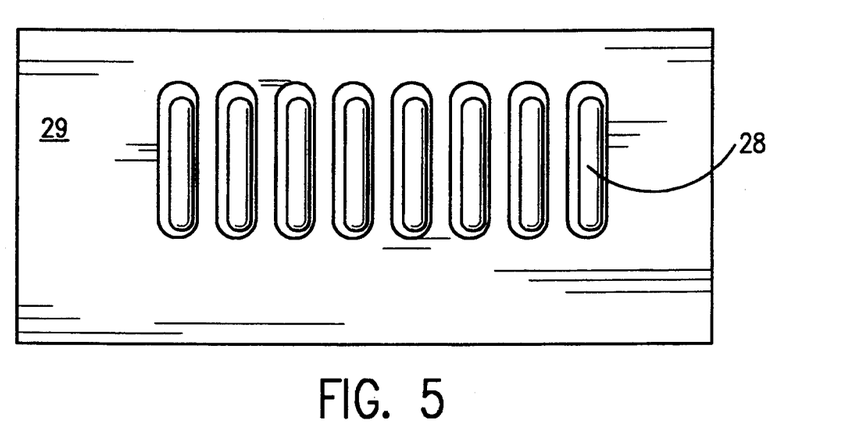
FIG. 5 is a top view of typical pads before solder paste printing.
Figure 6:
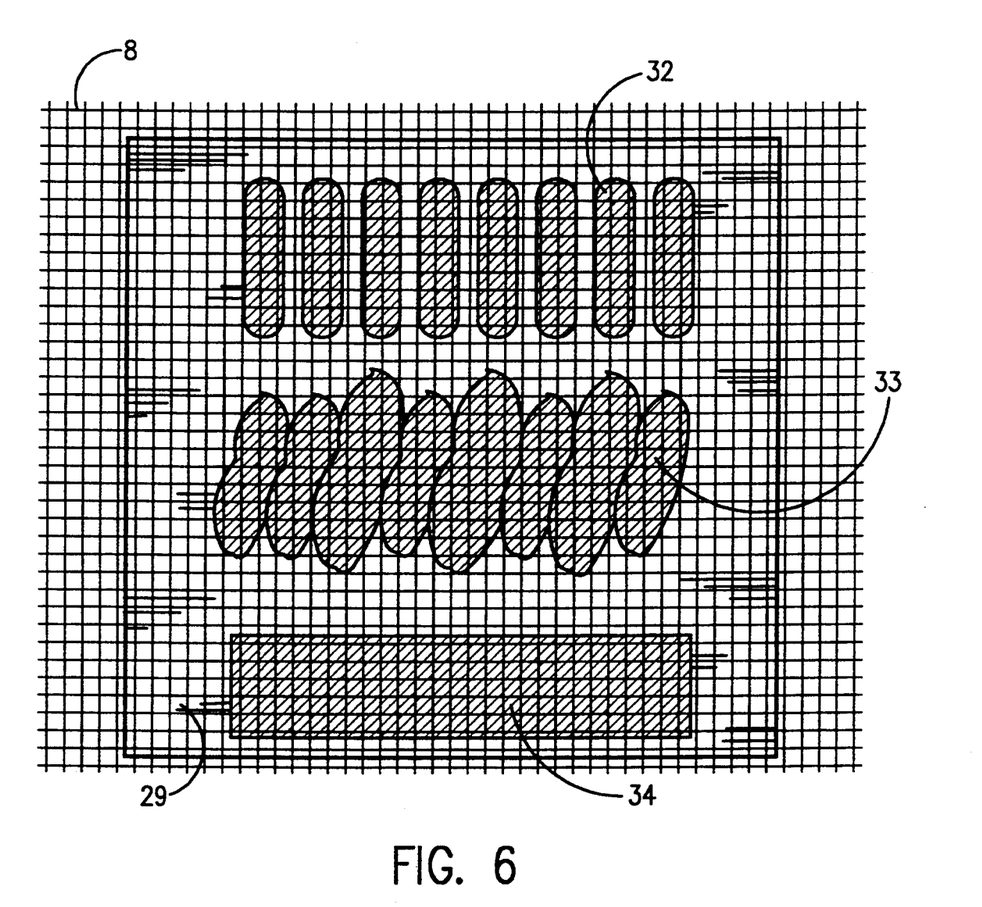
FIG. 6 is a top view of FIG. 5 after application of solder paste by various techniques.

In FIG. 2 which is a schematic side view of the apparatus, gear rack 26, which runs along one side of the machine, synchronizes the movement of the cam shafts. In FIG. 3, the solder paste 27 has been sifted, covering the pads 28, so that the mesh is in contact with the permanent solder mask 29. This sifting has actually created short circuits 30. In FIG. 4 one can see the solder balls 31 which have risen above the mesh. FIG. 5 illustrates typical exposed pads 28 surrounded by the permanent solder mask 29. In FIG. 6 one can see perfectly printed solder paste 32, printed after the first use of a stencil and with proper resolution; while imperfectly printed solder paste 33 is the same paste printed through the same stencil after the third use of that stencil showing the excess paste producing continuous short circuits. Block printing 34 covers the entire section of pads with uniform printing of shorts.

As to the operation of the apparatus, in one embodiment of this invention the machine uses computer control of the motors and other controls plus thumbwheels to control speed, direction and the like. All electronics are housed in a module away from the heat inside the cabinet (not shown) of the apparatus. At the start of an operation, button controls activate blower 20, heating element 14 and the exhaust amplifier 24 thereby sweeping ambient air into the chamber, heating it, expelling it through nozzle 15 and then exhausting it while maintaining equilibrium atmospheric pressure within the cabinet of the machine.

Table 1 having a PCB 2 thereon (this, of course, could be a number of PCBs or a panel containing a number of PCBs depending upon their size) moves into the cabinet on bearings 3 when motor 4 and actuator 1 are energized. When table 1 stops inside the cabinet, frame 6, containing chase 7 and mesh 8 is lowered onto the PCB so that the tension of the mesh is transmitted thereto with the vibration of the mesh enhancing close contact with the solder mask. This lowering of the mesh is accomplished by activation of motor 9 rotating gears 10, cams 11 and cam shaft 12.

With the mesh in place, the heating element 14/nozzle 15/scraper 16 assembly is lowered to a distance from the PCB just sufficient to melt the solder. With the nozzle in place, the assembly is moved over the PCB, which latter is in a fixed position, at a rate adequate to reflow the solder as it moves. The nozzle is designed with an overall length necessary to treat the surface area of the PCBs within the design parameters of the individual machine. The scraper which moves in concert with the heating element sweeps the excess solder forward and ultimately off the mesh leaving a clean surface allowing easy removal of the mesh from the PCB after the operation is completed and the heating element and frame have been raised. The table 1 is again activated and moves out of the cabinet whereupon the PCB is removed and replaced with another for a subsequent treatment.

The solder deposits are formed by covering a printed circuit board with a mesh material, in intimate contact with the mask, as a first compressive surface stretched on a weighted or hinged chase, the latter embodying a second compressive surface (in the instant embodiment, the table) to provide uniform compression, heating said compressed printed circuit board uniformly at an elevated temperature sufficient to melt said solder deposits, cooling while compressed and removing said cooled printed circuit board from between the mesh material and the second compressive surface, whereby the solder deposits are thereby formed into a most desirable configuration; and the top surface thereof is impressed with the mesh configuration.

By use of an 8 mil thick stencil for printing the solder paste, for example, excess solder paste is printed on the circuit board especially in the case of fine pitch where, in a sense, block printing is occurring creating short circuits in the process. One is actually printing short circuits with this technique. The vibrator plays an important role in the process in that it enhances sifting of the solder paste up through the mesh while, at the same time, promoting contact with the permanent solder mask on the board as the mesh is lowered under tension and vibration. Oftentimes one cannot see any part of the mesh since it becomes buried in the paste.

As the solder paste is heated, volatiles are driven off. The metallic solder remaining on a pad is anchored to the copper and due to the unusual properties of solder "attracts" solder from adjacent dams where there is little affinity for the solder since it rests on the permanent solder mask. The synergistic properties of the solder and its surface tension combined with the mesh promotes the "wicking back" towards the pad where the mesh causes the solder to rise to the surface of the mesh forming solder balls which are easily removed by the scraper.

The solder on more distant isolated dams either wicks up directly above the surface of the mesh, so long as there is excess solder present, or balls up and remains under the mesh on the solder mask. In the former case, these solder balls are removed by the scraper; in the latter case, subsequent cleaning of the board easily removes them. Consequently the short circuits which have been printed, as well as those which might have already been present, are removed by the formation of solder balls which are swept off the mesh by the scraper or removed in the cleaning process. This dynamic behavior of the molten solder has been observed by a motion picture film of the process at 170 magnification.

Other embodiments of this invention employ a heating element 14 which does not use hot air, but rather utilizes laser, hot bar or hot oil as the method of heating.

In another embodiment of this invention, the solder balls can be removed by vacuuming the surface of the mesh; a technique quite usual when reworking a solder joint.

In yet another embodiment, heated rollers are placed in contact with the mesh before the nozzle, moving in concert with it and thereby pre-heating the solder paste and further insuring that the mesh has been pressed down onto the solder mask. Modifications of this embodiment would not necessarily require the use of a chase, the mesh alone can be placed in contact with the PCB and the heated rollers.

In still another embodiment, both compression surfaces can be mesh material itself stretched on a weighted chase, for example, constructed and arranged such that registration is maintained while forming the softened solder. In other words, both sides of a board can be formed at one time by clamping the ends and having mesh and heat sources on both sides either in a horizontal or vertical position. With less mass to be heated residence time at temperature is shortened. Apparatus to form solder simultaneously on both sides of a PCB would be considerably more expensive than the single sided preferred embodiment discussed above but, nevertheless, would also significantly improve productivity.

The formed solder deposit of this invention permits joining with a second solder deposit, such as a ball grid array (BGA) component having solder bumps thereon, without squeezing out solder and short circuiting the final solder connection between the component and the circuit board.

In a further embodiment of this invention, rather than screening, stenciling provided at least equivalent performance without the need for precise registration. With stencils, as shown in the bottom of FIG. 6, one can squeegee a relatively uniform thickness of paste over a large enough area to encompass a number of SMD pads; these blocks of pads can be covered with solder as a unit. Such PCBs are always only partially loaded with SMD pads anyway. When the solder melts, the excess balls-up, and since it does not wet the solder mask, it rolls off the mesh leaving near-perfectly formed solid solder deposits with a high degree of co-planarity. Thus, not only are screen printing and precise registration with all their related problems eliminated, but rework is simplified by using the same technique; no special rework tool is required. It should be noted that the mesh ought to be in contact with the solder mask to inhibit the solder on the pads from wicking-up excess solder.

The foregoing description of the specific embodiments will so fully reveal the general nature of the invention that others can, by applying current knowledge, readily modify and/or adapt for various applications such specific embodiments without departing from the generic concept, and, therefore, such modifications and adaptations should and are intended to be comprehended within the meaning and range of equivalents of the disclosed embodiments. It is to be understood that the phraseology or terminology employed herein is for the purpose of description and not of limitation.

What is claimed is:

1. An apparatus for forming solder deposits on a circuit board comprising:
    (a) a printed circuit board having said solder deposits which are to be formed on pads thereof;
    (b) mesh means in contact with and covering a first side of said printed circuit board for forming said solder deposits; and
    (c) heating means cooperating with the mesh means and said printed circuit board for reftowing and forming said solder deposits.

2. The apparatus of claim 1 further comprising:
    (a) a blower for introducing air into the apparatus, a hot air heating means, a nozzle for supplying and directing heated air to said solder deposits for melting said solder deposits, and an air amplifier for removing said heated air from the apparatus;
    (b) a support means and a transport drive means for supporting, moving, raising and lowering the printed circuit board towards and away from said heating means;
    (c) the mesh means comprising a frame, a chase, a mesh, and a vibration means for uniformly contacting the mesh against the printed circuit board and the permanent solder mask thereof and for sifting solder paste; and
    (d) a solder remover device attached to said nozzle for removing solder balls from the surface of said mesh.

3. In the apparatus of claim 2 wherein the solder removal device for removing solder balls is selected from the group consisting of a scraper and a vacuuming device.

4. The apparatus of claim 2 wherein the mesh means further comprising a second mesh on a second side of said printed circuit board for forming said solder deposits on said second side simultaneously with said first side of said printed circuit board.

5. In apparatus of claim 1, said heating means are selected from the group consisting of hot air, heated rollers, laser hot bar and hot oil.

6. In the apparatus of claim 5 wherein the heated rollers further comprise roller surfaces which are mesh and a source of hot air passing therethrough.

7. The apparatus of claim 1 wherein means for depositing said solder deposits are selected from the group consisting of screen printing, stencilling, jet printing, and automatically dispensing said solder paste, electroplating and by immersion in a molten solder bath.

8. The apparatus of claim 1 wherein the mesh means further is sized and positioned for:
    (a) containing the thus-reflowed solder within the approximate periphery of the pads;
    (b) moving the thus-reflowed solder upwards and downwards within the mesh; and
    (c) imprinting the grid pattern of the mesh on the uppermost portion of said solder deposit which has risen above the surface of a permanent solder mask.

9. The apparatus of claim 1 wherein the uniform contacting is done at a uniform pressure sufficient to form softened solder.

10. The apparatus of claim 1 wherein said heating means raises the temperature of said solder deposits sufficient to soften solder.

11. The apparatus of claim 1 wherein the mesh means is selected from the group consisting of stainless steels, glass cloths, chemically milled screens, chemically milled plates and laser-machined plates.

12. The apparatus of claim 1 wherein the circuit board is a hybrid circuit board.

13. The apparatus of claim 1 wherein the solder deposited is selected from the group consisting of solid solder, solder paste, solder cream and solder powder.

14. The apparatus of claim 1 wherein said solder deposits are deposited by block stencil printing.

15. The apparatus of claim 1 wherein top surfaces of said solder deposits are imprinted with the mesh configuration.

16. In an apparatus for contacting a screen with a substrate wherein the screen is associated with a frame hingedly connected and in latching engagement with a plate whereon rests the substrate, the improvement comprising:
   (a) a printed circuit board substrate having solder deposits which are to be formed on the pads thereof;
   (b) a mesh means associated with said frame in contact with said solder deposits for forming said solder deposits;
   (c) a planar means cooperating with said frame for receiving said printed circuit board and pushing said board against the mesh means; and
   (d) heating means cooperating with said board for reflowing said solder deposits.

* * * * *